United States Patent

Tallon et al.

[11] Patent Number: 5,340,794
[45] Date of Patent: Aug. 23, 1994

[54] FLUX PINNING IN SUPERCONDUCTING CUPRATES

[75] Inventors: Jeffery L. Tallon, York Bay; Donald M. Pooke, Lower Hut, both of New Zealand

[73] Assignee: Her Majesty the Queen in right of New Zealand, Lower Hutt, New Zealand

[21] Appl. No.: 853,397

[22] Filed: Mar. 18, 1992

Related U.S. Application Data

[63] Continuation-in-part of Ser. No. 728,857, Jul. 11, 1991, abandoned, which is a continuation-in-part of Ser. No. 562,083, Aug. 2, 1990, abandoned.

[30] Foreign Application Priority Data

Aug. 2, 1989 [NZ] New Zealand .................. 230183
Feb. 2, 1990 [NZ] New Zealand .................. 232364
Jul. 11, 1990 [NZ] New Zealand .................. 234469
Mar. 18, 1991 [NZ] New Zealand .................. 237470

[51] Int. Cl.$^5$ .................. H01B 1/08; H01B 12/00
[52] U.S. Cl. .................. 505/500; 252/518; 252/521; 505/125; 505/126
[58] Field of Search .................. 505/1; 252/518, 521

[56] References Cited

U.S. PATENT DOCUMENTS

| | | | |
|---|---|---|---|
| 4,956,336 | 9/1990 | Salama et al. ............. | 505/1 |
| 5,024,992 | 6/1991 | Morris ..................... | 505/1 |
| 5,077,272 | 12/1991 | Chen et al. ............... | 505/1 |
| 5,084,436 | 1/1992 | Morimoto et al. .......... | 505/1 |

OTHER PUBLICATIONS

Beeli et al. "Crystal Structure of a new Superconducting High-Pressure Phase in the YBaCrO-System" Cond. Matter 73, 313–319 (1988).
Bordet et al. "Structure Determination of the New High Tc Superconductor $Y_2Ba_4Cu_7O_{14+x}$" Nature vol. 334, Aug. 18, 1988.
Saito et al, "High-Tc Superconducting Properties in $(Y_{1-x}Tl_x)Ba_2Cu_3O_{7\delta}$...", Physica 148B pp. 336–338 (1987).
Kumakura et al, "Large Magnetization in $YBa_2Cu_3O_7$ Prepared by Sintering at High-Temperature", Jap. Jrnl. App. Phys. vol. 27, No. 2, Feb. 1988.
Frase et al, "Phase Compatibilities in the System $Y_2O_3$—BaO—CuO", Adv. Cer. Mat. vol. 2, No. 3B. (1987).
Chen et al, "Superconductivity and the Tailoring of Lattice Parameters of the Compound $YBa_2Cu_3O_x$" Adv. Cer. Mat. vol. 2, No. 3B (1987).
Iguchi et al, "Structural and Superconducting Properties of $YBa_2Cu_3O_{7-\delta}$ Formed Under Oxygen Pressure Control", Jap. Jrnl. App. Phys. vol. 27, No. 6, Jun. 1988.
Hauck et al, "Oxygen Content of Superconducting $Ba_2YCu_3O_{6.5+x}$" Z. Phys. B-Cond. Matter vol. 67 pp. 299–302 (1987).
Kishio et al, "Determination of Oxygen Nonstoichiometry in a High-Tc Superconductor $Ba_2YCu_3O_{7-\delta}$", Jap. Jrnl. App. Phys. vol. 26, No.7 pp. L1228–L1230, Jul. 1987.
Xiao et al., "Flux Pinning and Critical Current Density in Y—Ba—Cu—O Superconductors", Phys. Rev. B vol. 36(4) pp. 2382–2385, Aug. 1, 1987.
Sawano et al., "Effects of Synthesis Conditions on Microstructure...", Nippon Ser. Ky. Gak. Ron. 97(10), pp. 1028–1033, 1989.
Dinger et al., "Direct Observation of Electronic Anisotropy in Single-Crystal $Y_1Ba_2Cu_3O_{7-x}$" Phys. Rev. Let. vol. 58(25) pp. 2687–2690, Jun. 22, 1987.
S. Jin et al., "Enhanced flux pinning by phase decomposition in Y—Ba—Cu—O", Appl. Phys. Lett 56 (13), Mar. 26, 1990.

Primary Examiner—Paul Lieberman
Assistant Examiner—M. Kopec
Attorney, Agent, or Firm—Dann, Dorfman, Herrell and Skillman

[57] ABSTRACT

The invention comprises a process of heat treatment to produce a high $T_c$ superconductor with increased flux pinning. A precursor compound is subjected to temperature and oxygen pressure conditions at which the precursor compound decomposes or converts partially or completely to the high $T_c$ superconductor and precipitated non-superconducting compounds which are dispersed through the structure of the high $T_c$ superconductor and which are effective to pin lines of magnetic flux. The precursor compound may or may not itself be a high $T_c$ superconductor. In the YBCO system, 2-4-7 may be converted to 1-2-3 or 1-2-3 to 2-4-7 and flux pinning copper oxides dispersed through the structure, for example, various other transformations are possible.

25 Claims, 7 Drawing Sheets

FLUX PINNING IN SUPERCONDUCTING CUPRATES

This application is a continuation-in-part of co-pending application Ser. No. 07/728,857, filed on Jul. 11, 1991, now abandoned, which is a continuation-in-part of application Ser. No. 07/562,083, filed on Aug. 2, 1990, now abandoned. Both of the foregoing applications are assigned to the assignee of the present application.

The present invention comprises novel materials comprising composite high-$T_c$ superconductors which contain a dispersion of precipitates and structural defects and thereby exhibit enhanced flux pinning and enhanced critical current in the superconducting state, and novel solid state heat treatment processes for their preparation.

It is known that conventional high critical-current intermetallic superconductors such as $Nb_3Sn(Ti)$, $Nb_3AlGe$ and NbTi may exhibit substantial enhancement of critical current by the process of controlling grain size and introducing defects and precipitates which pin magnetic flux lines (Superconductor Materials Science ed. by S. Foner and b. B. Schwartz, New York, Plenum, 1982. Also P. J. Lee et al, IEEE Trans. Magnetics 25 (1989)1918). In the mixed state where the induced magnetic field, comprising the sum of the external fields and the field created by the internal electrical current, lies between the lower and upper critical fields, magnetic flux lines penetrate the superconductor. The flux lines may order geometrically to form a flux lattice or they may remain disordered in the form of a flux liquid. When the current carried by a superconductor is altered, flux lines may creep across the superconductor dissipating energy and thus effectively introducing electrical resistance. Defects and precipitates of suitable size are effective in pinning these flux lines and, where the flux lines form a lattice, the pinning of a small fraction of the flux lines may achieve the pinning of the entire flux lattice. This allows an increase in the critical current. The size scale is determined by the coherence length ($\xi$) for the superconductor, which for conventional superconductors is typically $\xi \sim 1000 A$. It is expected that flux pinning in the high-$T_c$ superconductors may also be achieved by introducing defects and precipitates, but for these compounds the coherence length is much shorter so that the size scale for the precipitates is expected to be comparably shorter. For single crystals of $EuBa_2Cu_3O_7\epsilon$ with $T_c = 94K$ $\xi \sim 35A$ in the basal plane and $\sim 3.8A$ perpendicular to the basal plane (Y. Tajima et al, Physical Review B37, 7956 (1988)). This indicates that ultra-fine precipitates or defects of size less than 50A are required to effect flux pinning. Already it has been demonstrated that the introduction of defects by neutron irradiation of a single crystal of $YBa_2Cu_3O_7 - \delta$ achieves a 100-fold increase in magnetisation critical current by flux pinning (van Dover, Nature 342, 55 (1989)).

In one aspect the present invention comprises a process of heat treatment of otherwise stable chemical compounds of composition related to, but different from the final required composite high-$T_c$ superconductor. The heat treatment is carried out below the melting or partial melting point at a temperature and oxygen partial pressure at which the starting compound is unstable and therefore converts to the composite high-$T_c$ superconductor, thus dispersing structural defects and precipitate of residual compounds which are effective in enhancing flux pinning in the superconducting state. The process is carried out in the solid state by solid state diffusion.

The invention also comprises the resultant composite high-$T_c$ superconductor material.

According to the known methods of decomposition and precipitation, the fineness of the precipitates may be controlled by the temperature and duration of the heat treatment and may be assisted by mechanical treatment. The duration must be kept sufficiently short as to prevent diffusion and aggregation of the residual materials into large precipitates and especially to prevent accumulation at grain boundaries. The fineness and separation of the precipitates may also be controlled by substitution of atoms into the crystal structure of the compound to be decomposed, by so doing, introducing nucleation sites for decomposition and precipitation.

In this form of the invention as applied to the RBCO (R=Y or a lanthanide rare earth element/Ba/Cu/O) system the invention comprises heating $RBa_2Cu_4O_8$ (1-2-4) at a temperature and oxygen partial pressure at which 1-2-4 will convert to $R_2Ba_4Cu_7O_{15-\delta}$ (2-4-7) or at a temperature and oxygen partial pressure at which 1-2-4 will convert to $RBa_2Cu_3O_{7-\delta}$ (1-2-3), or heating 2-4-7 at a temperature and oxygen partial pressure at which 2-4-7 will convert to 1-2-4 or 1-2-3, or heating 1-2-3 at a temperature and oxygen partial pressure at which 1-2-3 will convert to 1-2-4 or 2-4-7. Heat treatments may be sufficiently short as to effect partial decomposition resulting in a composite material comprising the original superconductor with a dispersion of precipitates and also defects such as intergrowths or stacking faults, or may be sufficiently long as to effect complete or nearly complete decomposition of the original superconductor resulting in a composite material comprising the new superconductor together with defects and a dispersion of precipitates. Heat treatments of the superconductor 1-2-n resulting in the superconductor 1-2-p introduce precipitates of CuO when p<n or precipitates of 2-1-1 when p>n. The invention may be carried out with RBCO system compounds when R is or consists essentially of Y or any of the lanthanide rare earth elements La, Nd, Sm, Eu, Gd, Dy, Ho, Er, Tm or Yb or any thereof partially substituted by any of Na, K, Cs, Rb and Ca; and B is or consists essentially of Ba or Ba partially substituted by any of La, Nd, Ca, Sr, Pb, Na and K or any lanthanide rare earth element. If 1-2-3 is converted to 1-2-4 or 2-4-7, or 1-2-4 is converted to 2-4-7, excess CuO is preferably included to allow complete conversion. Alternatively the amount of excess CuO may be insufficient to allow complete conversion to introduce defects of 1-2-4 which will be effective in flux pinning. Excess $Y_2BaCuO_5$ (2-1-1) may also be included to assist in absorbing residual Ba/Cu/O from grain boundaries.

In this form of the invention as applied to the BCSCO (Bi/Ca/Sr/Cu/O) and Thallium systems, the invention comprises heating a bismuth or thallium superconducting cuprate to a temperature and oxygen partial pressure at which the cuprate will partially decompose to a lower homologue. By these systems is meant those superconductors in the form a homologous series of compounds of nominal composition $M_mR_nA_2Cu_nO_{4+2n}$ m=1,2,3 ... where M is any of or any combination of Bi, Pb, Tl and Sb, R is Ca or Ca partially substituted by Sr, Y, La or any of or any combination of the lanthanide rare earth elements, and A is either or both of Sr and Ba or any or both of Sr and Ba and any of the lanthanide rare earth elements. For a given oxygen partial pressure the maximum temperature for stability of the succession of homologues decreases as n increases. An n-homologue is heated above its maximum stability temperature, but below the maximum stability temperature of the p-homologue where p<n so as to partially convert the n-homologue to the p-homologue together with flux pinning precipitates including calcium oxide, copper oxide or calcium cuprate, together with defects and intergrowths.

In another aspect the present invention comprises the heat treatment of any superconducting porovskite cuprate compound to a temperature above and oxygen partial pressure below that at which the compound is stable, for duration sufficient to cause partial decomposition of the compound to non-superconducting phases thus dispersing precipitates of residual compounds which are effective in enhancing flux pinning in the superconducting state. After heat treatment the temperature and oxygen partial pressure are then altered to where the compound is stable, to prevent further decomposition. Compounds of the RBCO, BCSCO, Thallium and other superconducting systems may be thus heat treated to enhance flux pinning.

In general the heat treatment may be repeated several times and at several different temperatures and oxygen partial pressures to allow a distribution of precipitate sizes. Following heat treatment according to the invention to introduce defects and precipitates, the resultant composite superconductor may then be further annealed at temperatures and oxygen partial pressures as known for optimising superconductivity and/or maximising $T_c$ in the active superconducting component of the composite superconductor. Thus, for example, 1-2-3, 2-4-7, $Bi_2Sr_2Ca_2Cu_3O_{10+\delta}$ and $Tl_2Ba_2Ca_2Cu_3O_{10+\delta}$ may be slow-cooled and/or annealed between 350° and 450° C. in an oxygen partial pressure greater than or equal to 0.2 bar while $Bi_2Sr_2CaCu_2O_{8+\delta}$ and $Tl_2Ba_2CaCu_{8+\delta}$ may be annealed between 700° C. and 850° C. in an oxygen partial pressure less than or equal to 0.2 bar followed by quenching.

In the case of RBCO 1-2-3 and RBCO 1-2-4 it is preferred to partially substitute Ba by any of or any combination of La, Ca and the lanthanide rare earth elements and most preferably La. Preferred 1-2-3 compounds comprise $RB_{2-x}A_xCu_3O_{7-\delta}$ where $0<x\leq0.1$ and A is any of or any combination of La, Ca and the lanthanide rare earth elements and most preferably La and R and B are as previously defined, prepared by converting or partially converting A substituted 1-2-4 or 2-4-7 to 1-2-3 or by partially converting A substituted 1-2-3, or by subjecting A substituted 1-2-3 to a temperature and oxygen partial pressure at which 1-2-3 is unstable to partially decompose same and thereby forming flux pinning intergrowths and stacking faults and/or forming non-superconducting flux pinning precipitate and defects. In the case of RBCO 2-4-7 an 1-2-4 it is preferred to partially substitute R by A where A is as previously defined and most preferably Ca. Preferred 2-4-7 and 1-2-4 compounds comprise $R_{2-x}A_x$-$B_4Cu_7O_{15-\delta}$ or $R_{1-x}A_xB_2Cu_4O_8$ where $0<x\leq0.1$, A is as previously defined and most preferably Ca, and R and B are as previously defined, prepared by converting or partially converting A substituted 1-2-3 or 1-2-4 to 2-4-7 or A substituted 1-2-3 or 2-4-7 to 1-2-4, or by partially converting A substituted 2-4-7 or 1-2-4, or by subjecting A substituted 2-4-7 or 1-2-4 to a temperature and oxygen partial pressure at which 2-4-7 or 1-2-4 is unstable to partially decompose same and thereby forming flux pinning intergrowths and stacking faults and/or forming non-superconducting flux pinning precipitates and defects.

Preferably in addition to heat treatment to enhance flux pinning the material is subjected to melt-processing in which the material is slow-cooled through its melting point or partial melting point to densify the material and to texture the material to produce elongated grains, preferably aligned and atomically smooth. In the RBCO system the material may be subjected firstly to melt processing and the to flux pinning heat treatment to introduce precipitates, defects and intergrowths. As the domain of stability of 1-2-4 does not cross the melting line at moderate pressures it is less preferred to melt-process 1-2-4 and therefore to use it as the starting material. Most preferably 2-4-7 wherein Ba is partially substituted by La is melt processed and then subsequently converted to 1-2-3 by annealing. Also 1-2-3 may be melt processed together with excess CuO to allow subsequent conversion towards 2-4-7 or 1-2-4 by annealing; some excess 2-1-1 may also be included to assist in absorbing residual Ba/Cu/O from grain boundaries; and if the excess CuO is insufficient to effect complete conversion to 2-4-7 defect intergrowths of 1-2-4 occur which will be effective in flux pinning. The resultant material with average composition 1-2-p where $3<p<3.5$ is then loaded with oxygen according to known methods such as cooling in an oxygen-containing atmosphere. Alternatively, sufficient excess CuO may be included in the melt-processed material to convert to a high percentage of 1-2-4 but because $T_c$ for this system is low (80K) this material is preferably then converted back to 2-4-7 or 1-2-3 together with precipitates, defects and intergrowths.

In the BCSCO the Thallium systems melt processing may similarly be carried out by slow cooling through the partial melting point and, as for the RBCO system, additional CuO may be added in order to supress the melting point. Such additional CuO may be in the form of a local excess.

The starting precursor material such as R/Ba/Cu/O powder may be compacted into a metal tube formed of a metal having high oxygen permeability, which will not melt at the processing temperature, and which is inert in relation to the superconductor precursors during processing, the metal tube then being drawn down in diameter, then optionally bundled together with other drawn wires then further drawn to produce a multifilamentary wire, and the wire(s) then subjected to melt processing and heat treatment for flux pinning. Suitable metals are silver and silver palladium alloys.

Flux pinning heat treatment may comprise a combination of heat treatment to convert to another superconducting compound and heat treatment to cause partial decomposition to non-superconducting phases.

In the accompanying figures which are referred to in the following description.

Figure 1:
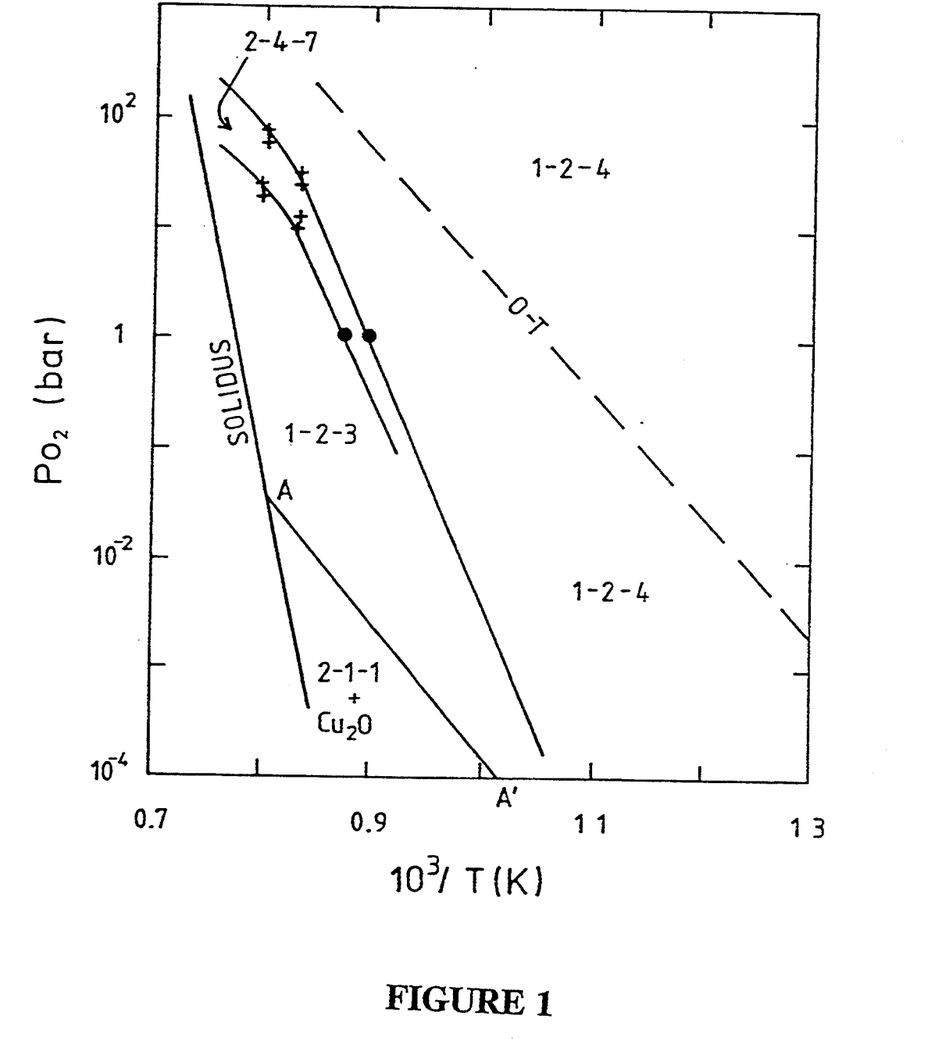
FIG. 1 is a plot of the phase stability boundaries of 1-2-3, 2-4-7 and 1-2-4 in the domain of oxygen partial pressure and temperature. The line A—A' shows the general stability boundary beyond which 1-2-3 decomposes to 2-1-1 and other phases. This appears to be a general stability boundary for all perovskite cuprates.
Figure 7:
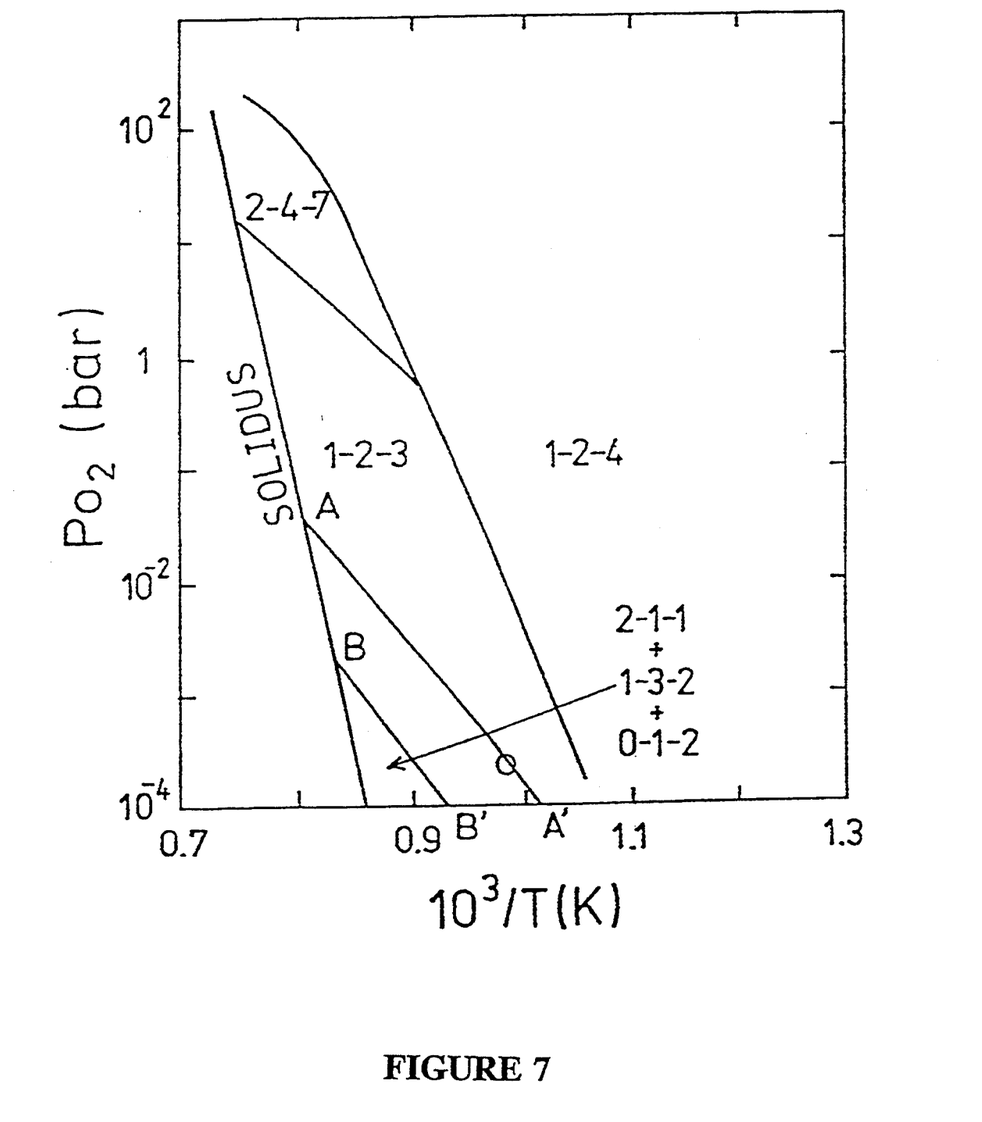
FIG. 7 shows the phase stability boundaries of 1-2-3, 2-4-7 and 1-2-7 from FIG. 1 but the lower pressure boundary for 2-4-7 as corrected according to our more recent measurements.

FIGS. 1 and 7 show the phase diagram for the RBCO system where R is Y with composition near the atomic ratios 1/2/3/7. The phase diagram is similar for other compounds where Y is replaced by a lanthanide rare earth element. At high temperatures, but below the melting line, $YBa_2Cu_3O_{7-\delta}$ (1-2-3) is the stable compound. A narrow band of stability exists for $Y_2Ba_4Cu_7O_{15-\delta}$ (2-4-7 or alternatively referred to as 1-2-3.5) and then at lower temperatures $YBa_2Cu_4O_8$ (1-2-4) is the stable phase. Across the lower pressure domain of the phase diagram, there runs a further stability boundary marked A—A' below which these compounds decompose to $Y_2BaCuO_5$ (2-1-1) which is believed to be a useful flux pinning phase and other phases. The boundary A—A' appears also to be the stability boundary for the high $T_c$ superconductor $Bi_2Sr_2CaCu_2O_8$ (Physica C162-164 (1989) 81-82) and roughly coincides with the phase boundary between CuO and $Cu_2O$ (Physica C162-164 (1989) 441-442). It is believed that the boundary A—A' is the stability boundary for many pervoskite cuprates including the known superconducting cuprates.

Heat treatment in accordance with the invention to produce composite materials exhibiting enhanced flux pinning includes:

1 $RBa_2Cu_nO_{4+n-\delta}$ where n=3, 3.5 or 4 and $0\leq\delta\leq1$ for n=3, $0\leq\delta\leq0.5$ for n=3.5 and <0.1 for n=4, and with precipitates of $R_2BaCuO_5$ obtained by heat treatment of $RBa_2Cu_mO_{4+m-\delta}$ where m=3, 3.5 or 4 and $m\leq n$ below the boundary A—A' in FIG. 1, that is, heat treatment at oxygen partial pressure $P_{O_2}$ satisfying $P_{O_2}<1.84\times10^{10}\exp(-32800/T)$ bar where T is the temperature in degrees Kelvin.

2 Any of the compounds: $Bi_{a-x}Pb_xSr_bCa_cCu_2O_d$ with precipitates where $0\leq x\leq0.5$, $2<a<2.25$, $1.85<b<1.15$, $0.85<c<1.15$ and $7.7<d<8.3$; $Bi_{a-x}Pb_xSr_bCa_cCu_3O_d$ with precipitates where $0\leq x\leq0.5$, $2<a<2.25$, $1.85<b<1.15$, $1.85<c<2.25$ and $9.6<d<10.4$; together with all obvious derivative compounds including those where Bi is partially substituted by Tl; in which the compound is annealed below the boundary A—A' as defined in paragraph 1 above in order to introduce the precipitates of CuO and other phases.

3 Any of the compounds: $Tl_{a-x}Pb_xBa_bCa_cCu_2O_d$ with precipitates where $0\leq x\leq0.5$, $2<a<2.25$, $1.85<b<1.15$, $0.85<c<1.15$ and $7.7<d<8.3$; $Tl_{a-x}Pb_xBa_bCa_cCu_3O_d$ with precipitates where $0\leq x\leq0.5$, $2<a<2.25$, $1.85<b,1.15$, $1.85<c<2.25$ and $9.6<d<10.4$; together with all obvious derivative compounds including those where Tl is partially substituted by Bi; in which the compound is annealed below the boundary A—A' as defined in paragraph 1 in order to introduce precipitates.

Any of the compounds: $Tl_aPb_xSr_bCa_cCu_2O_d$ with precipitates where $0.4<a,x<0.6$, $1.85<b<1.15$, $0.85<c<1.15$ and $6.7<d<7.3$; $Tl_aPb_xSr_bCa_cCu_3O_d$ with precipitates where $0.4<a,x<0.6$, $1.85<b<1.15$, $1.85<c<2.25$ and $8.6<d<9.4$; together with all obvious derivative compounds including those where Tl or Pb are partially replaced by Bi and including those in which Ca and/or Sr are partially replaced by R where R is defined previously; in which the compound is annealed below the boundary A—A' as defined in paragraph 1 in order to introduce precipitates.

$RBa_2Cu_3O_{7-\delta}$ (1-2-3) with precipitates of $CuO_v$ with $0\leq v\leq1$ obtained by heat treatment of $RBa_2Cu_4O_8$ (1-2-4) or of $R_2Ba_4Cu_7O_{15-\delta}$ (2-4-7) where R is defined as in paragraph 1. According to the present invention, 1-2-4 or 2-4-7 may be heated to any temperature above 870° C. in any oxygen partial pressure to cause decomposition to 1-2-3 together with $CuO_v$. Other defects and phases may also appear. Temperatures between 870° C. and 920° C. are preferred in order to keep the duration of required heat treatment longer than a practical minimum duration of 1 second. The use of 2-4-7 as the starting material may be preferred in order to reduce the size of copper oxide particles which are precipitated. As in each of the following, incomplete decomposition may be desirable so that final compositions lie intemediate between those specified above.

$R_2Ba_4Cu_{7+f}O_{15+f-\delta}$ with precipitates of $CuO_v$ and other defects and phases obtained by heat treatment of $R_2Ba_4Cu_{7+s}O_{15+g-d}$ where R is as defined above, $0\leq\delta,d\leq2$, $-1\leq s$, $f\leq+1$ and $f<s$.

2-4-7 together with precipitates of $R_2BaCuO_5$, $BaCuO_2$, $R_2Ba_4O_7$ and other defects and phases obtained from heat treatment of 1-2-3. Under an oxygen partial pressure ($P_{O_2}$) of 1 atmosphere 1-2-3 may be heated at a temperature T between 845° C. and 870° C. in order to decompose to 2-4-7. More generally heat treatment may be at T (in units of °C.) and $P_{O_2}$ (in units of Pa) satisfying $1210-180L+21L^2<T<596-32L+17.2L^x$ where $L=\log_{10}P_{O_2}$. This has the benefit that 1-2-3 may first be processed (by for example melt-processing or the use of alkali fluxes) to be highly textured with oriented and extended grains prior to the precipitation heat treatment thus yielding textured 2-4-7 together with precipitates.

1-2-4 together with precipitates obtained from heat treatment of 1-2-3 or 2-4-7 which may be textured. Heat treatment below 845° C. in 1 atmosphere of oxygen is required or more generally at T and $P_{O_2}$ satisfying $T<1220-180L+21L^2$.

1-2-3 together with precipitates of 2-4-7 and other precipitates including $R_2BaCuO_5$, $BaCuO_2$ and $R_2Ba$-

$4O_7$ and defects obtained from heat treatment of 1-2-3 as described in paragraph 7.

1-2-3 together with precipitates of 1-2-4, 2-4-7 and other precipitates including $R_2BaCuO_5$, $BaCuO_2$ and $R_2Ba_4O_7$ and defects obtained from heat treatment of 1-2-3 as described in paragraph 8.

$R_2Ba_4Cu_7O_{15+f-\delta}$ with precipitates obtained by heat treatment of $R_2Ba_4Cu_{7+s}O_{15+g-d}$ where $0 \leq \delta$, $d \leq 2$, $-1 \leq s$, $f \leq +1$ and $f > s$.

2-1-2-2 compounds together with precipitates of $CuO_v$, CaO or $CaCuO_2$ and other defects obtained by heat treatment of 2-2-2-3 compounds above their maximum stability temperature but below the maximum stability temperature of the 2-1-2-2 compound. Here 2-1-2-2 refers to the class of compounds of nominal composition $M_2CaA_2Cu_2O_{8+\delta}$ and 2-2-2-3 refers to compounds of nominal composition $M_2Ca_2A_2Cu_3O_{10+\delta}$ where $-0.5 < \delta < 1.0$, M is any combination of Bi, Pb, Tl and Sb and A is any combination of Ca, Sr or Ba. The composition is referred to as nominal in that small quantities (<15%) of M may substitute on the Ca or A site. Ca and A may also be intersubstituted. According to the present invention $Bi_{2-x}Pb_xCa_2Sr_2Cu_3O_{10+\delta}$, $0 \leq x \leq 0.5$ may be prepared according to known methods at temperatures between 800° and 855° C. in air then heat treated in air at temperatures exceeding 860° C. in order to partially or nearly fully convert to $Bi_{2-x}Pb_xCaSr_2Cu_2O_{8+\delta}$ together with precipitates. The composite material subsequently would have to be annealed and quenched at temperatures and oxygen partial pressures known to maximise $T_c$ at 90K or more (Tallon et al, Physia C158, 247 (1989)). Similarly $Tl_2Ca_2Ba_2Cu_3O_{10+\delta}$ may be converted to $Tl_2CaBa_2Cu_2O_{8+\delta}$ together with precipitates and defects by heat treatment above 900° C.

2-2-2-3 compounds, together with precipitates of any of 2-1-2-2, 2-0-2-1 compounds, $CuO_v$, CaO or $CaCuO_2$ and other defects obtained by heat treatment of 2-2-2-3 compounds as described in paragraph 12. Here 2-0-2-1 refer to the class of compounds of nominal composition $M_2A_2CuO_6$ where M and A are as described in paragraph 12.

1-1-2-2 compounds together with precipitates of $CuO_v$, CaO or $CaCuO_2$ obtained by heat treatment of 1-2-2-3 or 2-2-2-3 compounds. Here 1-1-2-2 and 1-2-2-3 refer to the classes of compounds of nominal composition $MCaA_2Cu_2O_{7+\delta}$ and $MCa_2A_2Cu_3O_{9+\delta}$ where $-0.5 < \delta < 1.0$, M is any combination of Tl, Pb, Bi and Sb and A is any combination of Sr, Ba and R, when R is defined in paragraph S. A preferred example is $Tl_{0.5}Pb_{0.5}Ca_{1-x}R_xSr_2Cu_2O_{7+\delta}$, $0 < x < 0.4$ together with precipitates obtained by heat treatment of $Tl_{0.5}Pb_{0.5}Ca_{2-x}R_xSr_2Cu_3O_{9+\delta}$, $Tl_{1.5}Pb_{0.5}Ca_{1-x}R_xSr_2Cu_2O_{8+\delta}$ or $Tl_{1.5}Pb_{0.5}Ca_{2-x}R_xSr_2Cu_3O_{10+\delta}$. Another preferred example is $Tl_{0.5}Pb_{0.5}CaSr_{2-x}La_xCu_2O_{7+\delta}$, $0 < x < 0.4$ together with precipitates obtained by heat treatment of $Tl_{0.5}Pb_{0.5}Ca_2Sr_{2-x}La_xCu_3O_{9+\delta}$, $Tl_{1.5}Pb_{0.5}CaSr_{2-x}La_xCu_2O_{8+\delta}$ or $Tl_{1.5}Pb_{0.5}Ca_2Sr_{2-x}La_xCu_3O_{10+\delta}$.

1-2-2-3 compounds together with precipitates of any of 1-1-2-2, 1-0-2-1 compounds, $CuO_v$, CaO or $CaCuO_2$ obtained by heat treatment of 1-2-2-3 compounds.

1-1-2-2 compounds together with precipitates of any of 1-0-2-1, $CuO_v$, CaO or $CaCuO_2$ obtained by heat treatment of 1-1-2-2 compounds. A preferred example is $Tl_{0.5}Pb_{0.5}Ca_{1-x}R_xSr_2Cu_2O_{7+\delta}$ $0 < x < 0.4$ together with precipitates of any of $Tl_{0.5}Pb_{0.5}Sr_2CuO_{5+\delta}$, CuO, CaO, $Y_2O_3$ or $CaCuO_2$ obtained from heat treatment of $Tl_{0.5}Pb_{0.5}Ca_{1-y}R_ySr_2Cu_2O_{7+\delta}$, $0 < y < 0.4$ Heat treatment in accordance with the invention for enhancing flux pinning also including densification and texturing by melt processing includes:

Stage (i): melt process (by slow cooling through the solidus temperature) a mixture of precursor materials having overall nominal composition corresponding to $1\text{-}2\text{-}3 + \alpha 2\text{-}1\text{-}1 + \beta CuO$. Here $\alpha$ lies between 0 and 0.25 and $\beta$ lies between 0 and 0.5. The precursor materials may comprise any suitable combination of compounds of the cations such as 2-1-1, $BaCuO_2$, CuO, $Y_2O_3$, or nitrates, carbonates, or oxides, for example. This may result in excess 2-1-1 phase which is effective in absorbing $BaCuO_2$ rich phases from the grain boundaries, together with excess CuO distributed in grain boundaries and void spaces.

Stage (ii): The excess CuO is absorbed into the 1-2-3 structure by annealing in the domain of ability of 2-4-7 given by $1210 - 180L + 21L^2 < T < 596 - 32L + 17.2L^2$ where T is in °C. and $L = \log_{10}P_{O_2}$ and the oxygen partial pressure $P_{O_2}$ is in units of Pa. This clears CuO from the grain boundaries and therefore increases the potential intergranular defects in the 1-2-3 matrix together with intergrowth terminations and other defects which enhance flux pinning. This could for example be carried out at $P_{O_2} = 10$ bar and $T \sim 930°$ C. namely below the melting point of silver if the precursor materials have previously been compacted into a metal tube of silver, for example.

Stage (iii): The resultant composite material is then loaded with oxygen by known techniques such as slow cooling in an oxygen-containing atmosphere.

Stage (i): as for stage (i) in process (1)

Stage (ii): The excess CuO is absorbed into the 1-2-3 structure by annealing in the domain of ability of 1-2-4 given by $T < 1210 - 180L + 21L^2$. This clears CuO from the grain boundaries and at the same time introduces 1-2-4 intergrowths in the 1-2-3 matrix.

Stage (iii): The resultant material is heat treated in the domain of stability of 1-2-3 given by $T > 596 - 32L + 17.2L^2$ and $T > 1210 - 180L + 21L^2$, or of 2-4-7 as defined in process (1), to phase decompose to 1-2-3 or 2-4-7, respectively, together with CuO precipitates and intergrowth defects, or is heat treated at temperatures above the low pressure boundary A—A' to phase decompose to 1-2-3, 2-1-1 CuO precipitates and intergrowth defects.

Stage (iv): The resultant composite material is then loaded with oxygen by known techniques such as slow cooling in an oxygen-containing atmosphere.

Particularly preferred is the process (1) or (2) where the substituent atoms La or Ca are introduced in the precursor materials depending on the composition of the final product. If the dominant superconducting component is 1-2-3 then La is substituted for between 1 and 5% of the Ba in the precursor. If the dominant superconducting component is 2-4-7 then Ca is substituted for between 1 and 5% of the Y in the precursor. The substituent provides nucleation sites for the phase conversion, provides extrinsic flux pinning, increases $T_c$ in the superconducting phase and shifts the irreversibility line to higher temperatures.

Particularly preferred in the process 1, 2 or 3 above where the melt-processed precursor is in contact with a substrate or cladding material comprising silver, a silver palladium alloy, or other metal in which the melt processing stage (i) is carried out at sufficiently low oxygen partial pressure (less than $2 \times 10^3$ Pa for example) and sufficient CuO such that the precursor melting temperature, and hence the processing temperature, remains at all times below the melting point thereof. The excess CuO may be a local excess which is progressively displaced along by the moving melt zone.

Figure 2:
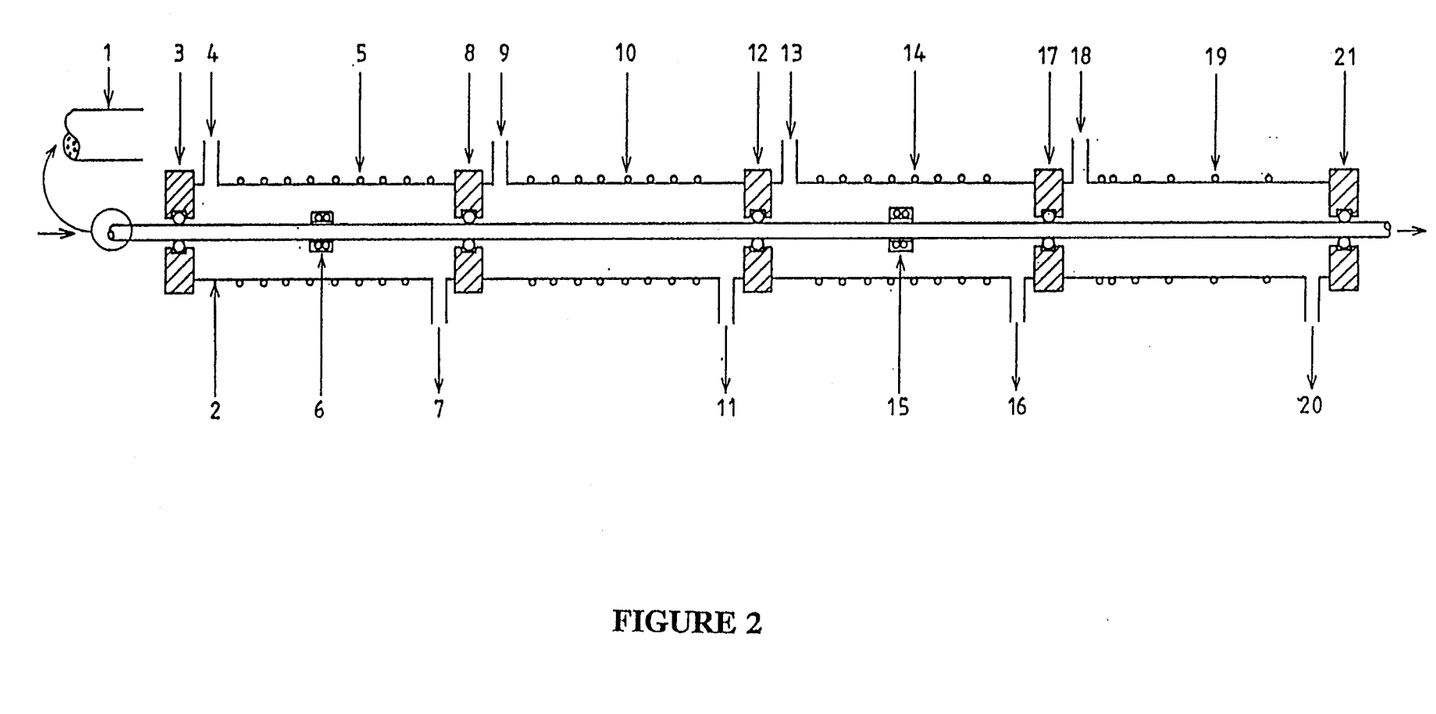
FIG. 2 is a schematic diagram of a process for manufacturing multifilamentary RBCO wire in a matrix of silver.

In a continuous manufacturing process the heat treatments for melt processing, flux pinning, and annealing to optimise Tc may be carried out in succession as shown schematically in FIG. 2 wherein a multifilamentary wire 1 of circular cross-section, each comprising a matrix of silver, silver palladium alloy, or other suitable metal containing the precursor materials, such as R/Ba/Cu/O precursor powders produced by cycles of drawing and annealing, is passed continuously but slowly through a pressure tube 2 which is divided into segments all sealed from each other using O-ring seals 3, 8, 12, 17 and 21 to allow four or more heat treatments under different oxygen partial pressures. The first stage is the melt-processing stage. Gas with a low oxygen partial pressure ($<2 \times 10^3$ Pa) enters port 4 and exits port 7. The furnace 5 heats the wire to near the melting point of the R/Ba/Cu/O and the zone-heater 6 raises the temperature locally above the melting point for the ambient oxygen partial pressure but below the melting point of the cladding metal. In the second stage the furnace 10 converts the melt-processed R/Ba/Cu/O towards 2-4-7 or 1-2-4 at a suitable oxygen partial pressure provided by the intake 9 and outlet 11. Where the material is to be converted back towards 1-2-3 the next furnace 14 with zone-heater 15 is operated at a suitable temperature and oxygen partial pressure provided by the intake 13 and outlet 16. This could, for example, provide conditions where the temperature exceeds the boundary A—A'. The final annealing stage provides for a flow of oxygen through the port 18 and outlet 20 together with a furnace 19 with temperature gradient to allow loading of oxygen into the resultant R/Ba/Cu/O material. The rate of movement of the wire and the lengths of the furnaces are commensurate with full equilibration of oxygen from the pressure tube 2 through the silver to the filamentary composite R/Ba/Cu/O material.

The following examples further illustrate the invention:

EXAMPLE 1

Figure 3:
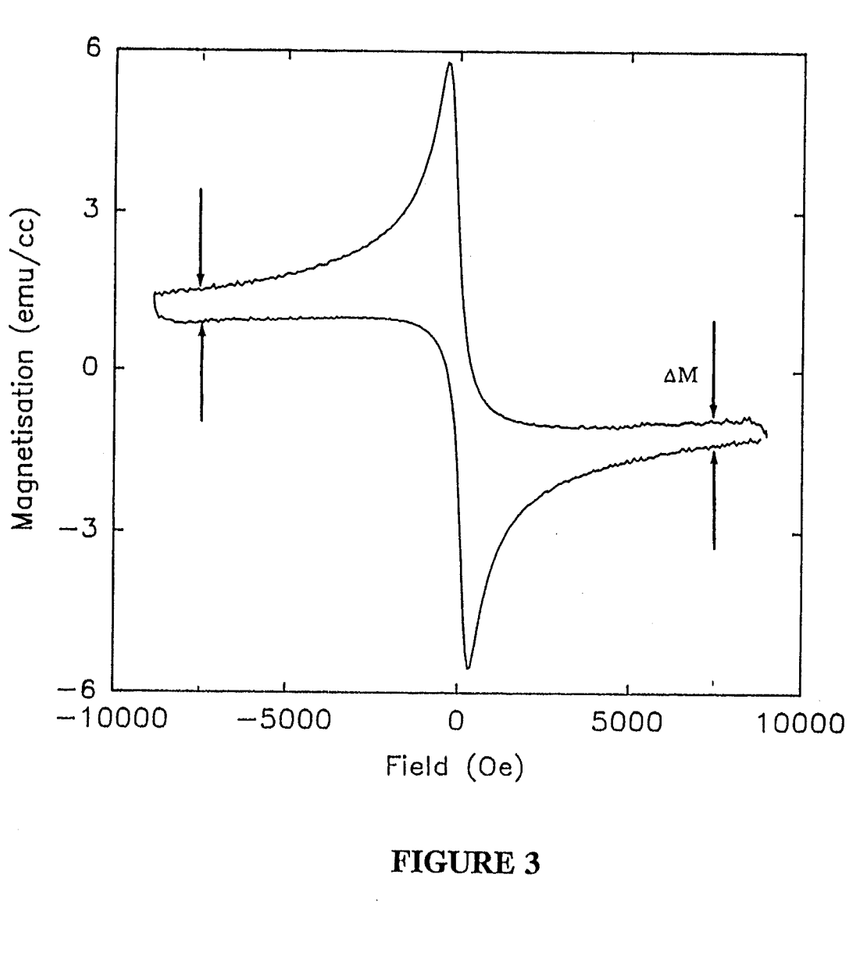
FIG. 3 is a plot of the magnetisation hysteresis loop for 1-2-4 processed to 1-2-3 for 3 minutes at 920° C. in 2% oxygen showing M measured at 7500 Oe at a temperature of T=75K.
Figure 4:
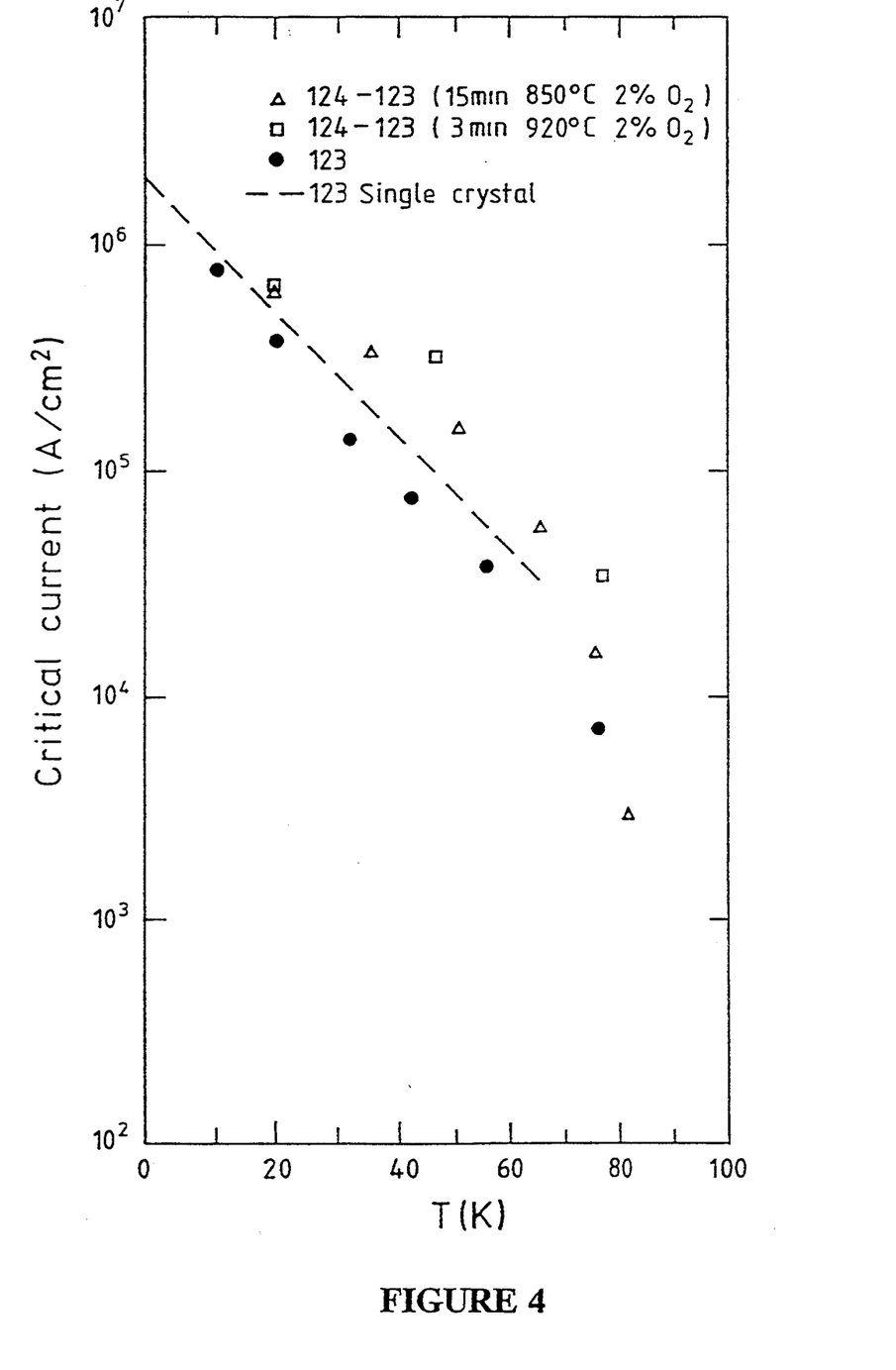
FIG. 4 shows the magnetisation critical current plotted as a function of temperature for 1-2-4 processed to 1-2-3 by annealing for 15 minutes at 850° C. (triangles) and for 3 minutes at 920°C. (squares) both in 2% oxygen in nitrogen. The data is compared with standard 1-2-3 (circles) and 1-2-3 single crystal (dashed line)
Figure 5:
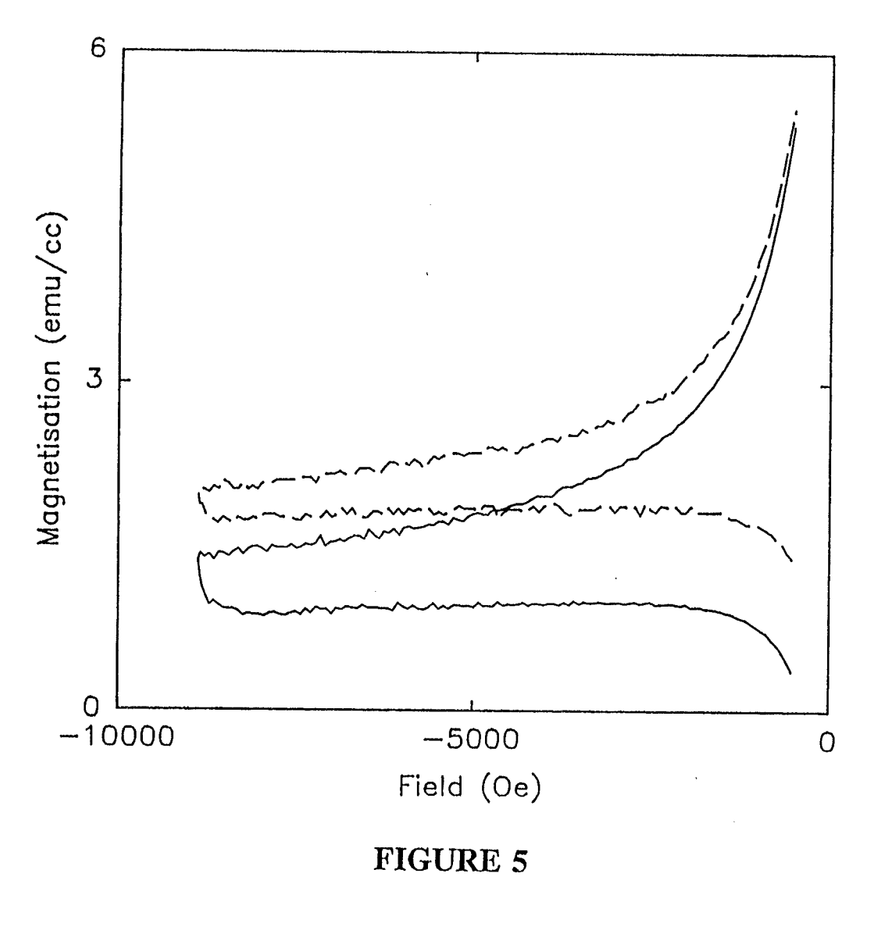
FIG. 5 shows a comparison of the magnetisation loop for 1-2-4 processed to 1-2-3 for 3 minutes at 920° C. in 2% oxygen (solid line) contrasted with standard 1-2-3 (dashed line) both at 75K. The standard 1-2-3 grain size is approximately double that for the processed material thus illustrating an enhancement of critical current of about 4 times.

Samples of $YBa_2Cu_4O_8$ were prepared using stoichiometric proportions of $Y_2O_3$, $Ba(NO_3)_2$ and sub-micron sized powders of CuO together with 0.2 mole fraction of $NaNO_3$ as a flux. The precursor material was decomposed at 700° C. for 1 hour in air then ground, milled an die-pressed into pellets and reacted/sintered at 815° C. in flowing oxygen at 1 bar. The pellets were reacted for about 4 days with at least two intermediate grinding, milling and die-pressing steps. At completion of synthesis most of the alkali had evaporated off. Rods of dimension 3 mm $\times$ 2 mm $\times$ 2 mm were cut from the pellets and heat treated for a short length of time in 2% oxygen in nitrogen gas in order to partially or fully convert the 1-2-4 to 1-2-3. These samples were then slow-cooled in flowing oxygen and annealed overnight at 350° C. Samples of $YBa_2Cu_3O_{7-\delta}$ were also prepared by conventional means for comparison. Magnetisation hysteresis loops were measured at various temperatures using a PAR Vibrating Sample Magnetometer. An estimate of intra-grain critical current may be made assuming a Bean-type critical state model: $Jc = 30 \times M/d$ where M is the magnetisation difference for increasing and decreasing fields as shown in FIG. 3, and d is representative of the grain dimension. Here, if M is measured in emu/cc, d in cm, then Jc is in Amp/cm$^2$. The magnetisation critical current is plotted as a function of temperature in FIG. 4 for 1-2-4 samples annealed for different temperatures and times and compared with ceramic and single crystalline 1-2-3. Both samples of 1-2-4 which were converted to 1-2-3 show enhancements in critical current density over the whole temperature range and at 77K the largest enhancement is by a factor of nearly four over ceramic 1-2-3 for the 1-2-4 sample annealed for 3 minutes at 920° C. for this $J_c$ reached $4 \times 10^4$ Amps/cm$^2$. The magnetisation for this processed sample is compared with that for the standard 1-2-3 in FIG. 5. The magnetisation enhancement is by a factor of two and, in addition, the 1-2-3 grain size is double that of the processed 1-2-4 giving an overall enhancement in critical current density of about four times. If the particle dimension is taken to be half the figure used, as is arguable, the magnetisation critical current is of the order of $10^5$ Amps/cm$^2$.

EXAMPLE 2

15 different perovskite cuprates were prepared by solid state reaction of oxides and nitrates at temperatures appropriate for single phase synthesis. Materials were die-pressed into 13 mm pellets which were reacted over several days with several intermediate grindings followed by milling an pelletising. Phase purity was confirmed by x-ray diffraction and impurity phases were typically less than 5% of maximum diffraction intensity. Each of the samples were annealed for 5 hours in a flowing atmosphere of 0.02% oxygen in nitrogen at progressively higher temperatures between 650° C. and 830° C. with the aim of traversing the boundary A—A' shown in FIG. 1 which lies at 750° C. for this oxygen partial pressure. X-ray diffraction patterns were collected from the surfaces of the pellets and decomposition was determined by the reduction in intensity of reflections for the original cuprate and the increase of intensity of impurity reflections, a common impurity phase being $Cu_2O$ as A—A' is also the boundary between CuO and $Cu_2O$. Results are given in Table 1 which lists the starting materials, their structure type and oxygen coordination of copper and the temperature at which decomposition first started. Each of the high-$T_c$ superconductors with $T_c > 60K$ decomposed close to 750° C. and therefore the boundary A—A' is common to each of these and may be used for heat treatment processing to induce flux pinning precipitates. These materials included a variety of materials raised to $Bi_2CaSr_2Cu_2O_8$, $Bi_2Ca_2Sr_2Cu_3O_{10}$, $YBa_2Cu_4O_8$ and $Tl_{0.5}Pb_{0.5}CaSr_2Cu_2O_7$. In addition, the non-superconductor $Ca_{0.86}Sr_{0.14}CuO_2$ decomposed at this boundary. This material is the parent compound for all of the superconducting cuprate homologues being the $n = \infty$ member of these homologous series. It comprises alternating planes of square-planar $CuO_2$ and Ca/Sr. The remaining materials which did not decompose have $CuO_2$ planes which are heavily stressed (as shown by the bond valence sum parameter in the last column) by the non-copper substructures and therefore in these, stability is determined by the non-copper structure.

TABLE I

Compounds investigated in the present work together with their structural types, decomposition temperatures in an oxygen partial pressure of 20 Pa and bond valence sums, $V_+$.

| Label | Compound | Nominal Designation | No of Copper Layers | Co-ordination | Decomposition temperature (°C.) | $V_+$** |
|---|---|---|---|---|---|---|
| A | $Bi_{1.85}Pb_{0.35}Sr_{1.4}Ca_{0.4}CuO_6$ | 2021 | 1 | octahedra | melted 776 | −0.88 |
| B | $Bi_2CaSr_2Cu_2O_8$ | 2122 | 2 | square pyramid | 746* | −0.35 |
| C | $Bi_{1.85}Pb_{0.3}Ca_{0.9}Sr_2Cu_2O_8$ | 2122 | 2 | square pyramid | 765 | −0.35 |
| D | $Bi_2YSr_2Cu_2O_{8+\delta}$ | 2122 | 2 | square pyramid | stable to 840 | not available |
| E | $Bi_{1.85}Pb_{0.35}Ca_{1.9}Sr_2Cu_3O_{10}$ | 2223 | 3 | planar diamond + square pyramid | 745 | −0.02 |
| F | $Ca_{0.86}Sr_{0.14}CuO_2$ | 0101 | ∞ | planar diamond | 733 | −0.05 |
| G | $Ti_{0.5}Pb_{0.5}CaSr_2Cu_2O_7$ | 1122 | 2 | square pyramid | 737 | −0.47 |
| H | $YBa_2Cu_3O_{7-\delta}$ | 123 | 2 | square pyramid | 866 | −0.19 |
| I | $YBa_2Cu_4O_8$ | 124 | 2 | square pyramid | 660° C. (→123) | −0.14 |
| J | $La_{1.9}Sr_{0.1}CuO_4$ | 201 | 1 | octahedra | stable to 840° C. | −0.99 |
| K | $Nd_2CuO_4$ | 201 | 1 | planar diamond | " | +0.70 |
| L | $Gd_2CuO_4$ | 201 | 1 | planar diamond | " | +0.54 |
| M | $La_2CaCu_2O_6$ | 212 | 2 | square pyramid | " | −0.57 |
| N | $Sr_2CuO_3$ | 201 | 1 (chains) | distorted planar diamond, nearly linear chain | " | −0.06 |
| O | $SrCuO_2$ | 202 | 2 (ribbons) | planar diamond | some conversion to $Sr_2CuO_3$ at 736° C. | −0.39 |

EXAMPLE 3

Figure 6:
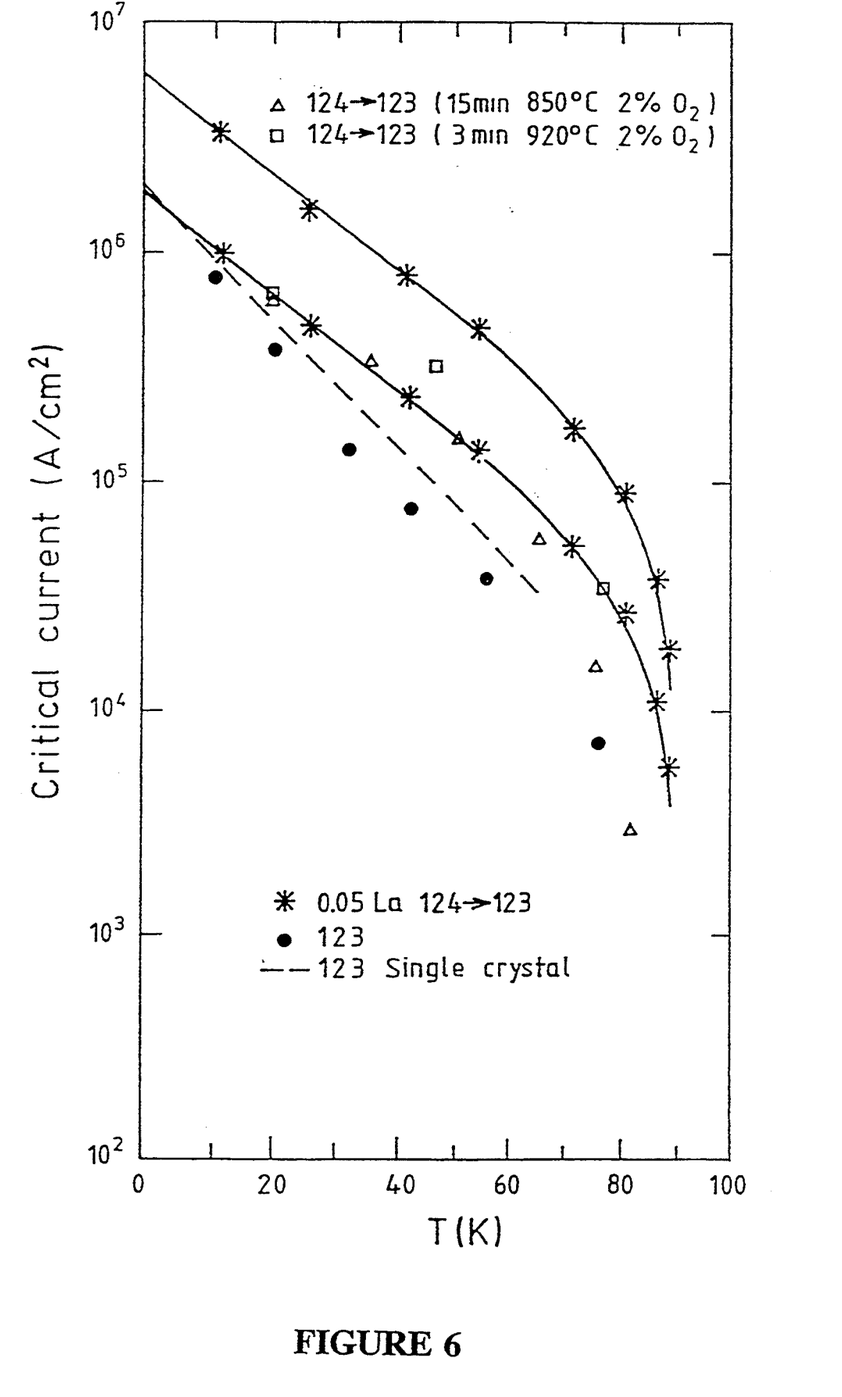
FIG. 6 shows the magnetisation critical currents shown in FIG. 4 together with those (asterisks) calculated from magnetisation measurements on samples of $YBa_{1.95}La_{0.05}Cu_4O_8$ processed to $YBa_{1.95}La_{0.05}Cu_3O_7+CuO$ and other possible precipitates by heat treating at $P_{O_2}=2\times10^{-4}$ bar and a temperature of 870° C. as described in Example 3. The upper curve of asterisks is for data calculated using a grain size of 2 um from SEM measurements. The lower curve assumes that the critical current at 0K is unenhanced.

Samples of $YBa_{1.95}La_{0.05}Cu_4O_8$ were prepared by mixing CuO and $Y_2O_3$ with the nitrates of Ba and La in stoichiometric quantities mixing, milling and decomposing at 750° C. for 1 hour. This result was re-milled, die-pressed into 13 mm pellets an reacted for 3 days at 930° C. in oxygen at 60 bar. At several intermediate points the pellets were removed, re-milled and re-pelletised. The result was single phase 1-2-4 structure as revealed by x-ray diffraction. One pellet was cut into 4 bars (1.5 mm×1.5 mm×5 mm) using a diamond wire saw and each of 3 of these were annealed for a different period of time in a vertical furnace at ~870° C. in 200 ppm oxygen in nitrogen, i.e., well above the A—A' boundary (750° C.). The furnace tube was evacuated and back-filled with the gas mixture to ensure the required oxygen partial pressure was obtained. Each of the samples were supported in a small gold boat and raised near to the hot zone but ~200° C. below the maximum temperature, then equilibrated. The samples were then raised into the hot zone for 1 minute, 4 minutes and 20 minutes respectively then cooled rapidly by dropping out of the furnace. The mass changes in the samples were consistent with decomposition of the 1-2-4 structure to 1-2-3. The samples were then slow cooled in flowing oxygen to 390° C. and annealed there overnight to oxygen-load. The temperature dependent magnetisation of each sample was measured as described in Example 1. Most notably, magnetisation at 7500 Oe was detectable at a temperature as high as 88K, nearly 10K higher than the maximum detectable limit we had previously observed, including the strong flux-pinning sample in Example 1. Scanning electron micrographs sowed the grain size to be ~2 μm. The temperature dependent critical current calculated for these samples is shown in FIG. 6 by the asterisks (upper curve) and compared to unprocessed 1-2-3. The enhancements are considerable starting from a factor of 6 near 0K and rising to very large values above 80K. At 77K the critical current is ~$1.5 \times 10^5$ A/cm². It could be argued that the effective grain size is higher than that measured, due to the granular connectivity, with the result that the critical current is lower. A second curve is shown in FIG. 6 in which it is assumed that there is no enhancement at 0K. Even in this case the enhancements above 77K are in excess of 5 times and grow rapidly above 80K.

La was chosen as a substituent in 1-2-4 firstly to act as a uniformly-distributed nucleation site for decomposition, and secondly because 0.05 La substituted in 1-2-3 raises $T_c$ in that compound by up to 2K. Transmission electron micrographs of the processed material shows precipitates of CuO distributed throughout the 1-2-3 material several microns in size. It is evident that similar results could be obtained by starting from lanthanum substituted 2-4-7; $Y_2Ba_{3.9}La_{0.1}Cu_7O_{15-\delta}$ and decomposing this to 1-2-3. Similarly one could decompose 1-2-4 to 2-4-7. La in 2-4-7 depresses $T_c$ while 0.1 Ca in 2-4-7 raises $T_c$ by 2K to ~94K. Thus one could decompose $Y_{0.95}Ca_{0.05}Ba_2Cu_4O_8$ to $Y_{1.9}Ca_{0.1}Ba_4Cu_7O_{15}$. Such decomposition would have to be carried out in the 2-4-7 domain of stability above $P_{O_2} \sim$ 1 bar. The phase boundaries of 2-4-7 have been found by use to extend to lower pressure than that shown in FIG. 1. The corrected phase diagram is shown in FIG. 7. The boundary for decomposition of 1-2-3, 2-1-1 and other phases was also found to be the line B—B' shown in the corrected diagram.

EXAMPLE 4

Samples of $YBa_2Cu_3O_{7-\delta}$ (1-2-3) were prepared by conventional solid state synthesis. Bars of dimension 1.5 mm×1.5 mm×5.0 mm were cut from a sintered pellet and reacted for 9 days at 865° C. in flowing oxygen at 1 bar in order to partially convert to $Y_2Ba_4Cu_7O_{15-\delta}$(2-4-7). Magnetisation loops were measured as a function of temperature for the unprocessed 1-2-3 and several processed samples. The magnetisation ΔM at 7500 Oe was measured and found to be identical for the processed and unprocessed material below 30K. Above 30K a clear systematic enhancement in flux pinning is observed due to heat treatment which is the same for the three separately processed samples. At 60K the enhancement is 1.7 times, 2.3 times at 70K, 4 times at 77K and 5.3 times at 80K.

EXAMPLE 5

Samples of the 2-4-7 compound $YBa_{1.95}La_{0.05}Cu_{3.5}O_{7.5-\delta}$ were prepared by mixing stoichiometric quantities of the oxides of Cu and Y with the nitrates of Ba and La together with 0.2 mole fraction of NaNO$_3$ to act as a reaction rate enhancer. The mixture was decomposed at 700° C. for 1 hour the milled and die-pressed into pellets and reacted for 4 days at 865° C. in flowing oxygen at 1 bar. The pellets were reground twice during synthesis. The result was single phase La-substituted 2-4-7 as shown XRD with $T_c(R=0)=86K$. Bars of dimension 2 mm$\times$2 mm$\times$4 mm were cut from the pellets and, as in example 3, were subjected to a 4 minute anneal at 870° C. in 200 ppm oxygen in nitrogen. The mass change was consistent with 100% decomposition to 1-2-3+CuO and this was confirmed by XRD. The resulting material was oxygen loaded by slow cooling over 16 hours to 380° C. in flowing oxygen and investigated in a VSM magnetometer. A sharp diamagnetic onset occurred at 92.1K and the temperature dependence of the magnetisation was found to be as good as the best results obtained in example 3 for processing La-substituted 1-2-4 to La-substituted 1-2-3. There appears to be no special advantage, in this respect, in starting from 1-2-4 or 2-4-7. The advantage in starting from 2-4-7 is that is can be melt-processed at moderate pressures only ($\geqq$15 bar). Pressures in excess of 100 bar may be needed to melt-process 1-2-4.

The foregoing describes the invention including preferred forms and examples thereof. The preparation of derivative materials for forms other than sintered ceramic form, i.e. thin films, single crystals, filaments and powders other than those specifically exemplified will be within the scope of these skilled in the art in view of the foregoing.

We claim:

1. A process for producing a cuprate high $T_c$ superconductor, comprising subjecting a synthesized precursor cuprate perovskite compound comprising the component elements for the high $T_c$ superconductor to a temperature and oxygen partial pressure at which the precursor cuprate compound decomposes to the high $T_c$ superconductor but below the melting point thereof to decompose the precursor cuprate compound to the high $T_c$ superconductor and flux pinning-effective, dispersed copper oxides.

2. A process for producing a cuprate high $T_c$ superconductor, comprising subjecting a synthesized precursor cuprate perovskite compound which is a member of an homologous series of compounds also including said high $T_c$ superconductors, to a temperature and oxygen partial pressure at which the precursor cuprate compound converts to the high $T_c$ superconductor but below the melting point thereof to convert the precursor cuprate compound or at least part of the precursor cuprate compound content of the material to the high $T_c$ superconductor and flux pinning-effective, dispersed non-superconducting residual compounds.

3. A process for producing a high $T_c$ cuprate superconductor material, comprising subjecting a material comprising a first high $T_c$ cuprate superconductor which is a member of an homologous series also comprising a second high $T_c$ superconductor, to a temperature and oxygen partial pressure at which said first high $T_c$ superconductor converts to said second high $T_c$ superconductor but below the melting point thereof, to convert part of the first high $T_c$ superconductor content of the material to flux pinning-effective, intergrowths of the second high $T_c$ superconductor in said first high $T_c$ superconductor.

4. A process according to claim 1 for producing a cuprate high $T_c$ superconductor, comprising subjecting a synthesized precursor cuprate perovskite compound consisting essentially of elements R, B, Cu and O where R is Y, La, Ce, Pr, Nd, Sm, Eu, Gd, Dy, Ho Er, Tm, Yb, Na, Cs, Rb or Ca or any combination thereof and B is Ba or Ba in combination with any one or more of Ca, Sr, La, Li, Na, K, Rb and Cs, at a temperature and oxygen partial pressure at which the precursor cuprate compound decomposes to the 1-2-3 superconducting compound $RB_2Cu_3O_{7-\delta}$ but below the melting point thereof to decompose the precursor compound to the 1-2-3 superconducting compound and flux pinning-effective, dispersed copper oxides and structural defects.

5. A process according to claim 4 for producing a cuprate high $T_c$ superconductor comprising subjecting a material comprising the 2-4-7 compound $$R_2B_4Cu_{7+x}O_{15+x-\delta}$$

wherein
R is Y, La, Ce, Pr, Nd, Sm, Eu, Gd, Dy, Ho, Er, Tm, Yb, Na, K, Cs, Rb or Ca or any combination thereof;
B is Ba or Ba and any one or more of Ca, Sr, La, Li, Na, K, Rb and Cs in combination; and
x equals about 1 to a temperature and oxygen partial pressure at which the 2-4-7 compound decomposes to the 1-2-3 superconducting compound $RB_2Cu_3O_{7-\delta}$ but below the melting point thereof to decompose the 2-4-7 compound content of the material to the 1-2-3 superconducting compound and flux pinning-effective, dispersed copper oxides and defects or to decompose part of the 2-4-7 content of the material to flux pinning-effective intergrowths of said 1-2-3 superconducting compound and copper oxides.

6. A process according to claim 4 for producing a cuprate high $T_c$ superconductor comprising subjecting a material comprising the 1-2-4 compound $$RB_2Cu_4O_8$$

wherein
R is Y, La, Ce, Pr, Nd, Sm, Eu, Gd, Dy, Ho, Er, Tm, Yb, Na, K, Cs, Rb or Ca or any combination thereof; and
B is Ba or Ba and any one or more of Ca, Sr, La, Li, Na, K, Rb and Cs in combination;

to a temperature and oxygen partial pressure at which the 1-2-4 compound decomposes to the 1-2-3 superconducting compound $Rb_2Cu_3O_{7-\delta}$ but below the melting point thereof, to decompose the 1-2-4 compound content of the material to the 1-2-3 superconducting compound and flux pinning-effective, disposed copper oxides and defects or to decompose part of the 1-2-4 content of the material to flux pinning-effective intergrowths of said 1-2-3 superconducting compound and copper oxides.

7. A process according to claim 5 wherein the material is subjected to a temperature T in °C. and oxygen partial pressure $PO_2$ satisfying the equation $T<1210-180L+21L^2$ and $T<2320-581.5L+58L^2$ where $L=\log_{10}PO_2$.

8. A process according to claim 6 wherein the material is subjected to a temperature T in °C. and oxygen partial pressure $PO_2$ satisfying the equation $T<1210-180L+21L^2$ and $T<2320-581.5L+58L^2$ where $L=\log_{10}PO_2$.

9. A process for producing a cuprate high $T_c$ superconducting comprising subjecting a material comprising the 2-4-7 compound $$R_2B_4Cu_{7+x}O_{15+x-\delta}$$

wherein
R is Y, La, Ce, Pr, Nd, Sm, Eu, Gd, Dy, Ho, Er, Tm, Yb, Na, K, Cs, Rb or Ca or any combination thereof;
B is Ba or Ba and any one or more of Ca, Sr, La, Li, Na, K, Rb and Cs in combination; and
x equals about 1
to a temperature and oxygen partial pressure at which the 2-4-7 compound decomposes to the 1-2-4 superconducting compound $RB_2Cu_4O_8$ but below the melting point thereof, to decompose the 2-4-7 compound content of the material to the 1-2-4 superconducting compound and flux pinning-effective, dispersed non-superconducting compounds including the 2-1-1 compound $R_2BCuO_8$ and defects, or to decompose part of the 2-4-7 content of the material to flux pinning-effective intergrowths of said 1-2-4 superconducting compound and non-superconducting compounds including the 2-1-1 compound.

10. A process according to claim 9 wherein the 2-4-7 material is subjected to a temperature T in °C. and oxygen partial pressure PO2 satisfying the equation $T < 1220 - 180L + 21L^2$ where $L = \log_{10}PO_2$.

11. A process for preparing a cuprate high $T_c$ superconductor comprising subjecting a material comprising a synthesized cuprate high $T_c$ superconductor perovskite compound to a temperature and oxygen partial pressure at which the compound decomposes to non-superconducting compounds but below the melting point thereof for a time sufficient to decompose only part of the high $T_c$ superconductor content of the material to flux pinning-effective, dispersed non-superconducting compounds.

12. A process according to claim 11 comprising subjecting said material to a temperature T in degree Kelvin and oxygen partial pressure PO2 satisfying the equation $PO_2 < 1.84 \times 10^{10} \exp(-32800/T)$ bar.

13. A process according to claim 12 wherein said perovskite cuprate compound comprises $$RBCu_nO_{4+n-\delta}$$

where n equals 3, 3.5, or 4
R is Y, La, Nd, Sm, Eu, Gd, Dy, Ho, Er, Tm, Yb, Na, K, Cs or Rb or any combination thereof; and
B is B or Ba in combination with any of Ca, Sr, Pb, Na and K.

14. A process for preparing a cuprate high $T_c$ superconductor comprising subjecting a material comprising a synthesized precursor cuprate perovskite compound which is a lower member of an homologous series also including said high $T_c$ superconductor, to a temperature and oxygen partial pressure at which the precursor compound converts to said high $T_c$ superconductor to convert at least part of the precursor compound content of the material to the high $T_c$ superconductor and flux pinning-effective, dispersed non-superconducting compounds.

15. A process according to claim 14 for preparing a cuprate high $T_c$ superconductor comprising subjecting a material comprising the 1-2-3 material $RB_2Cu_3O_{7-\delta}$ wherein R is Y, La, Ce, Pr, Nd, Sm, Eu, Gd, Dy, Ho, Er, Tm, Yb, Na, K, Cs, Rb or Ca or any combination thereof; and B is Ba or Ba and any one or more of Ca, Sr, La, Li, Na, K, Rb and Cs in combination; to a temperature and oxygen partial pressure at which the 1-2-3 compound converts to the 2-4-7 compound $R_2B_4Cu_{7+x}O_{15+x-\delta}$ where x equals about 1, to convert the 1-2-3 compound converts to the 2-4-7 superconductor and flux pinning-effective, dispersed non-superconducting compounds.

16. A process according to claim 14 for preparing a cuprate high $T_c$ superconductor comprising heating a material comprising the 1-2-3 superconductor $RB_2Cu_3O_{7-\delta}$ wherein R is Y, La, Ce, Pr, Nd, Sm, Eu, Gd, Dy, Ho, Er, Tm, Yb, Na, K, Cs, Rb or Ca or any combination thereof; and B is Ba or Ba and any one or more of Ca, Sr, La, Li, Na, K, Rb and Cs in combination; at a temperature in oxygen partial pressure at which the 1-2-3 compound converts to the 2-4-7 superconductor $R_2B_4Cu_{7+x}O_{15+x-\delta}$ to convert part of the 1-2-3 compound content of the material to the 2-4-7 superconductor and flux pinning-effective, intergrowths of the 1-2-3 superconducting in the 2-4-7 superconductor and copper oxides.

17. A process according to claim 14 for preparing a cuprate high $T_c$ superconductor comprising subjecting a material comprising the 1-2-4 material $RB_2Cu_4O_8$ wherein R is Y, La, Ce, Pr, Nd, Sm, Eu, Gd, Dy, Ho, Er, Tm, Yb, Na, K, Cs, Rb or Ca or any combination thereof; and B is Ba or Ba and any one or more of Ca, Sr, La, Li, Na, K, Rb and Cs in combination; to a temperature and oxygen partial pressure at which the 1-2-4 compound converts to the 2-4-7 compound $R_2B_4Cu_{7+x}O_{15+x-\delta}$ where x equals about 1, to convert the 1-2-4 compound content of the material to the 2-4-7 superconductor and flux pinning-effective, dispersed non-superconducting compounds.

18. A process according to claim 14 for preparing a cuprate high $T_c$ superconductor comprising heating a material comprising the 1-2-3 superconductor $RB_2Cu_4O_8$ wherein R is Y, La, Ce, Pr, Nd, Sm, Eu, Gd, Dy, Ho, Er, Tm, Yb, Na, K, Cs, Rb or Ca or any combination thereof; and B is Ba or Ba and any one or more of Ca, Sr, La, Li, Na, K, Rb and Ce in combination; at a temperature in oxygen partial pressure at which the 1-2-4 compound converts to the 2-4-7 superconductor $R_2B_4Cu_{7+x}O_{15+x-\delta}$ where x equal about 1, to convert part of the 1-2-4 compound content of the material to the 2-4-7 superconductor and flux pinning-effective, intergrowths of the 1-2-4 superconducting in the 2-4-7 superconductor and copper oxides.

19. A process according to any one of claim 15 to 18 comprising subjecting the 1-2-3 or 1-2-4 material to a temperature T in °C. and oxygen partial pressure PO2 satisfying the equation $1210 - 180L + 21L^2 < T < 2320 - 581.5L + 58L^2$ where $L = \log_{10}PO_2$.

20. A process according to any one of claims 15 to 18 additionally including the step of subjecting the 1-2-3 or 1-2-4 material to a temperature and oxygen partial pressure in excess of the melting point thereof prior to said flux pinning treatment.

21. A process according to any one of claims 15 to 18 additionally including the step of mixing with the 1-2-3 or 1-2-4 material the 2-1-1 compound $R_2BaCuO_8$ in a proportion up to 25 mole percent of the 1-2-3 or 1-2-4 content of the material and CuO in proportion up to 50 mole percent of the 1-2-3 or 1-2-4 content of the material, or mixing with the 1-2-3 or 1-2-4 material which will produce the same in a composite material on reaction, and then subjecting the mixture to a temperature $T_1$ in degrees Kelvin and oxygen partial pressure $PO_{2-1}$ satisfying the equation $PO_{2-1} < 5.34 \times 10^{35} \exp(-109300/T_1)$, prior to the said flux pinning treatment.

22. A process according to any one of claims 15 to 18 additionally including the step of mixing with the 1-2-3 or 1-2-4 material the 2-1-1 compound $R_2BaCuO_8$ in a proportion up to 25 mole percent of the 1-2-3 or 1-2-4 content of the material and CuO in proportion up to 50 mole percent of the 1-2-3 or 1-2-4 content of the material, or mixing with the 1-2-3 or 1-2-4 material which will produce the same in a composite material on reaction, and then subjecting the mixture to a temperature $T_1$ in degrees Kelvin and oxygen partial pressure $PO_{2-1}$ satisfying the equation $PO_{2-1} < 5.34 \times 10^{36} \exp(-109300/T_1)$ prior to the said flux pinning treatment, and also including the step of after the said flux pinning treatment annealing the material at a temperature $T_3$ in the range about 350° to about 450° C. in an oxygen partial pressure $PO_{2-3}$ bar.

23. A process as claimed in any one of claims 5 to 8, wherein B is Ba partially substituted by La.

24. A process as claimed in claim 5 or claim 6 wherein B is Ba partially substituted by Ca.

25. A process as claimed in any one of claims 15 to 18, wherein B is Ba partially substituted by Ca.

* * * * *